(12) United States Patent
Lee et al.

(10) Patent No.: US 11,355,659 B2
(45) Date of Patent: Jun. 7, 2022

(54) CHIP PACKAGE AND MANUFACTURING METHOD THEREOF

(71) Applicant: XINTEC INC., Taoyuan (TW)

(72) Inventors: Po-Han Lee, Taipei (TW); Chia-Ming Cheng, New Taipei (TW); Wei-Ming Chien, Taoyuan (TW)

(73) Assignee: XINTEC iNC., Taoyuan (TW)

( * ) Notice: Subject to any disclaimer, the term of this patent is extended or adjusted under 35 U.S.C. 154(b) by 0 days.

(21) Appl. No.: 17/075,544

(22) Filed: Oct. 20, 2020

(65) Prior Publication Data
US 2021/0159350 A1  May 27, 2021

Related U.S. Application Data

(60) Provisional application No. 62/941,602, filed on Nov. 27, 2019.

(51) Int. Cl.
*H01L 31/0352* (2006.01)
*H01L 31/18* (2006.01)
*H01L 31/02* (2006.01)
*H01L 31/0216* (2014.01)

(52) U.S. Cl.
CPC .... *H01L 31/0352* (2013.01); *H01L 31/02005* (2013.01); *H01L 31/02164* (2013.01); *H01L 31/1876* (2013.01)

(58) Field of Classification Search
CPC ............. H01L 31/0352; H01L 31/1876; H01L 31/02005; H01L 31/02164; H01L 31/02161; H01L 31/1896
See application file for complete search history.

(56) References Cited

U.S. PATENT DOCUMENTS

| | | | |
|---|---|---|---|
| 5,757,057 A * | 5/1998 | Dabrowski | H01L 27/14643 257/438 |
| 6,483,098 B1 * | 11/2002 | Kato | G02B 6/4214 250/214.1 |
| 9,029,968 B2 | 5/2015 | Tsukagoshi et al. | |
| 2005/0145965 A1 * | 7/2005 | Yang | H01L 31/035281 257/432 |
| 2010/0053407 A1 | 3/2010 | Crisp et al. | |
| 2011/0108940 A1 * | 5/2011 | Huang | H01L 27/14689 257/447 |
| 2012/0193741 A1 * | 8/2012 | Borthakur | H01L 31/0203 257/433 |
| 2012/0193742 A1 * | 8/2012 | Hirano | H01L 31/0203 257/433 |
| 2014/0167197 A1 * | 6/2014 | JangJian | H01L 27/14623 257/437 |
| 2021/0038080 A1 * | 2/2021 | Easson | A61B 5/02433 |

FOREIGN PATENT DOCUMENTS

| | | | | |
|---|---|---|---|---|
| CN | 101138094 | | 3/2008 | |
| CN | 105742383 A | * | 7/2016 | |
| CN | 108122935 A | * | 6/2018 | ........... H01L 27/146 |
| TW | 200709451 | | 3/2007 | |
| WO | 2004034471 | | 4/2004 | |

\* cited by examiner

*Primary Examiner* — Sitaramarao S Yechuri
(74) *Attorney, Agent, or Firm* — Liu & Liu

(57) ABSTRACT

A chip package includes a chip and a conductive structure. A first surface of the chip has a photodiode. A second surface of the chip facing away from the first surface has a recess aligned with the photodiode. The conductive structure is located on the first surface of the chip.

15 Claims, 9 Drawing Sheets

CHIP PACKAGE AND MANUFACTURING METHOD THEREOF

RELATED APPLICATION

This application claims priority to U.S. Provisional Application Ser. No. 62/941,602, filed Nov. 27, 2019, which is herein incorporated by reference in its entirety.

BACKGROUND

Field of Invention

The present invention relates to a chip package and a manufacturing method of the chip package.

Description of Related Art

Typically, chip packages with sensing chip fall into two categories: front illumination (FSI) and backside illumination (BSI). There are structures such as metal wire layer, dielectric layer, solder balls, etc. on the incident side (top side) of the photodiode in FSI chip packages. Therefore, optical loss is likely to happen and the layout of the metal wire layer should be designed to reserve a channel for light propagation toward photodiode.

Although the metal wire layer and the dielectric layer are changed to the non-incident side (bottom side) of the photodiode in BSI chip package, such sensing chips with photodiode are often very thin in order to make a better transmittance of the silicon materials covering the incident side of the photodiode and to improve the sensibility of optical sensing. As a result, strength of the chip package would be insufficient, and additional supporting carriers should be set under the metal wire layer and the dielectric layer. This is unfavorable for miniaturization designs for chip packages.

SUMMARY

An aspect of the present invention is to provide a chip package.

According to an embodiment of the present invention, a chip package includes a chip and a conductive structure. The first surface of the chip has a photodiode. The second surface of the chip opposite to the first surface has a trench, and the trench is aligned to the photodiode. The conductive structure is located on the first surface of the chip.

In an embodiment of the present invention, the normal projection of the conductive structure on the first surface is spaced apart from the photodiode.

In an embodiment of the present invention, a part of the chip is located between the photodiode and the bottom surface of the trench.

In an embodiment of the present invention, the width of the trench is gradually decreased from the second surface to the bottom surface of the trench.

In an embodiment of the present invention, the width of the bottom surface of the trench is greater than or equal to the width of the photodiode.

In an embodiment of the present invention, a distance between the bottom surface of the trench and the first surface of the chip is greater than the thickness of the photodiode.

In an embodiment of the present invention, the aforementioned distance is in a range from 10 μm to 100 μm.

In an embodiment of the present invention, the trench has a bottom surface and a sidewall surrounding the bottom surface, and an obtuse angle is between the sidewall and the bottom surface.

In an embodiment of the present invention, the chip package further includes a stacked structure located between the first surface of the chip and the conductive structure, and having a metal wire layer and a dielectric layer that covers the metal wire layer.

In an embodiment of the present invention, the chip package further includes a light-shielding layer located between the stacked structure and the photodiode, and overlapping the photodiode.

In an embodiment of the present invention, the stacked structure has a surface opposite to the chip, and the chip package further includes a light-shielding layer, in which the light-shielding layer and the stacked structure are both located on the surface of the stacked structure, and the light-shielding layer overlaps the photodiode.

In an embodiment of the present invention, the chip package further includes a protective layer covering the trench and the second surface of the chip.

In an embodiment of the present invention, the chip package further includes an anti-reflection layer covering the trench and the second surface of the chip.

An aspect of the present invention is to provide a manufacturing method of a chip package.

According to an embodiment of the present invention, a manufacturing method of a chip package includes forming a conductive structure on a first surface of a wafer, wherein the first surface of the wafer has a photodiode; bonding a carrier to the first surface of the wafer using a temporary adhesive layer; etching a second surface of the wafer opposite to the first surface such that the second surface of the wafer has a trench aligned to the photodiode; and removing the carrier.

In an embodiment of the present invention, the manufacturing method of the chip package further includes polishing the second surface of the wafer before etching the second surface of the wafer.

In an embodiment of the present invention, the manufacturing method of the chip package further includes dicing the wafer after removing the carrier.

In the aforementioned embodiments of the present invention, since the first surface of the chip of the chip package has a photodiode, and the second surface of the chip has a trench, and the trench is aligned to the photodiode, the chip covering the photodiode may be made sufficiently thinner. When light enters the chip package by the trench, it may easily pass through the chip covering the photodiode and then be received by the photodiode, and the sensitivity of optical sensing may be improved effectively. Moreover, the second surface of the chip which does not cover the photodiode does not have a trench. Therefore, the chip package may have sufficient strength, and additional supporting carriers are not needed. This is favorable for miniaturization designs for chip packages.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
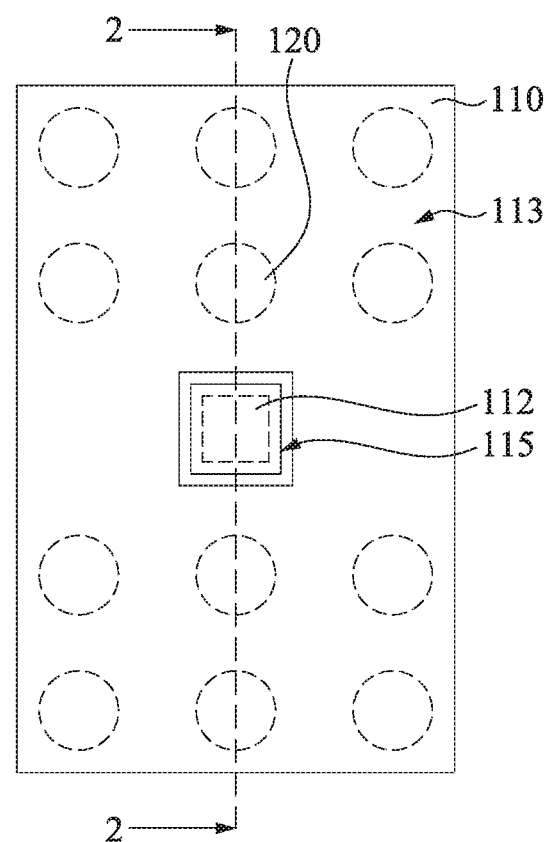
FIG. 1 is a bottom view of a chip package according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
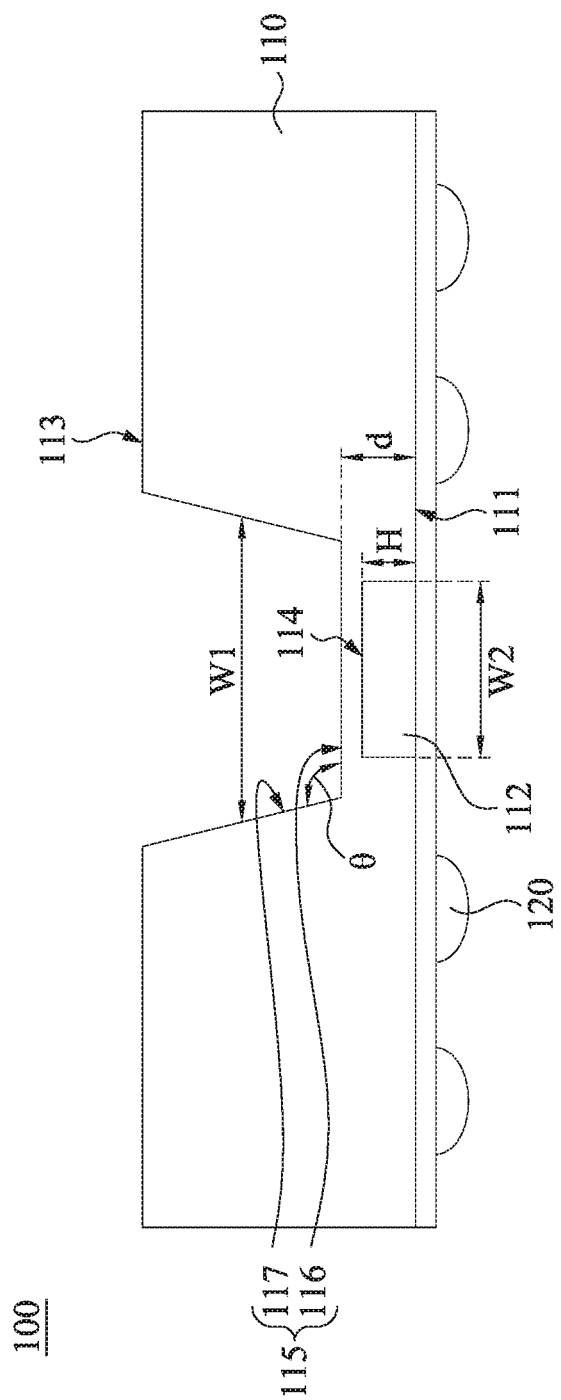
FIG. 2 is a cross-sectional view of the chip package taken alone line 2-2 shown in FIG. 1.

FIG. 1 is a bottom view of a chip package 100 according to one embodiment of the presented invention. FIG. 2 is a cross-sectional view of the chip package 100 taken along line 2-2 shown in FIG. 1. As shown in FIG. 1 and FIG. 2, the chip package 100 includes a chip 110 and a chip 120. A material of the chip 110 may include silicon. The thinner a thickness of the chip 110 (i.e., the thinner the silicon material), the better a transmittance of the chip 110. The chip 110 has a first surface 111 and a second surface 113 that are opposite to each other. The first surface 111 of the chip 110 has a photodiode 112, which is used to detect light. The second surface 113 of the chip 110 opposite to the first surface 111 has a trench 115, and the trench 115 is aligned to the photodiode 112. In this embodiment, a centerline of the trench 115 passes through a center of the photodiode 112. The conductive structure 120 is located on the first surface 111 of the chip 110, such that the chip package 100 may electrically connect external devices (e.g., circuit board) using the conductive structure 120.

In this embodiment, the chip package 100 is a BSI semiconductor structure. The photodiode 112 has a light-incident surface 114, which may receive light entering through the second surface 113 of the chip 110. Specifically, the photodiode 112 may receive light entering through the trench 115 of the chip 110.

Since the first surface 111 of the chip 110 of the chip package 100 has a photodiode 112, and the second surface 113 of the chip 110 has a trench 115, and the trench 115 is aligned to the photodiode 112, the chip 110 covering the photodiode 112 may be made sufficiently thinner. When light enters the chip package 100 by the trench 115, it may easily pass through the chip 110 covering the photodiode 112 (i.e., a distance between a bottom of the trench 115 and the light-incident surface 114 of the photodiode 112) and then be received by the photodiode 112, and the sensitivity of optical sensing may be improved effectively. Moreover, the second surface 113 of the chip 110 which does not cover the photodiode 112 does not have a trench 115 (i.e., a part of the chip 110 that surrounds the trench 115). Therefore, the chip package 100 may have sufficient strength, and additional supporting carriers are not needed. This is favorable for miniaturization designs for chip package 100.

In this embodiment, a normal projection of the conductive structure 120 on the first surface 111 of the chip 110 is spaced apart from the photodiode 112. Additionally, as shown in FIG. 1, the photodiode 112 may be located at a center of the chip 110. While in other embodiments, the photodiode 112 may deviate from the center of the chip 110. The present invention is not limited by a quantity of the photodiode 112 and a quantity of the trench 115, and the quantities may depend on the designer's need.

In this embodiment, the trench 115 has a bottom surface 116 and a sidewall 117 that surrounds the bottom surface 116. A part of the chip 110 is located between the photodiode 112 and the bottom surface 116 of the trench 115. Furthermore, a width W1 of the trench 115 is gradually decreased from the second surface 113 to a bottom surface 116 of the trench 115, and an obtuse angle θ is between the sidewall 117 of the trench 115 and the bottom surface 116. The width of the bottom surface 116 of the trench 115 is greater than or equal to a width W2 of the photodiode 112, and is beneficial to receive light. A distance d between the bottom surface 116 of the trench 115 and the first surface 111 of the chip 110 is greater than the thickness H of the photodiode 112, such that the light-incident surface 114 of the photodiode 112 is partially covered by the chip 110. In this embodiment, the distanced may be in a range from 10 μm to 100 μm.

It is to be noted that the connection relationship, materials, and advantages of the aforementioned elements will not be repeated. In the following description, a manufacturing method of the chip package 100 will be described. The chip package 100 may be packaged in a wafer level.

Figure 3:
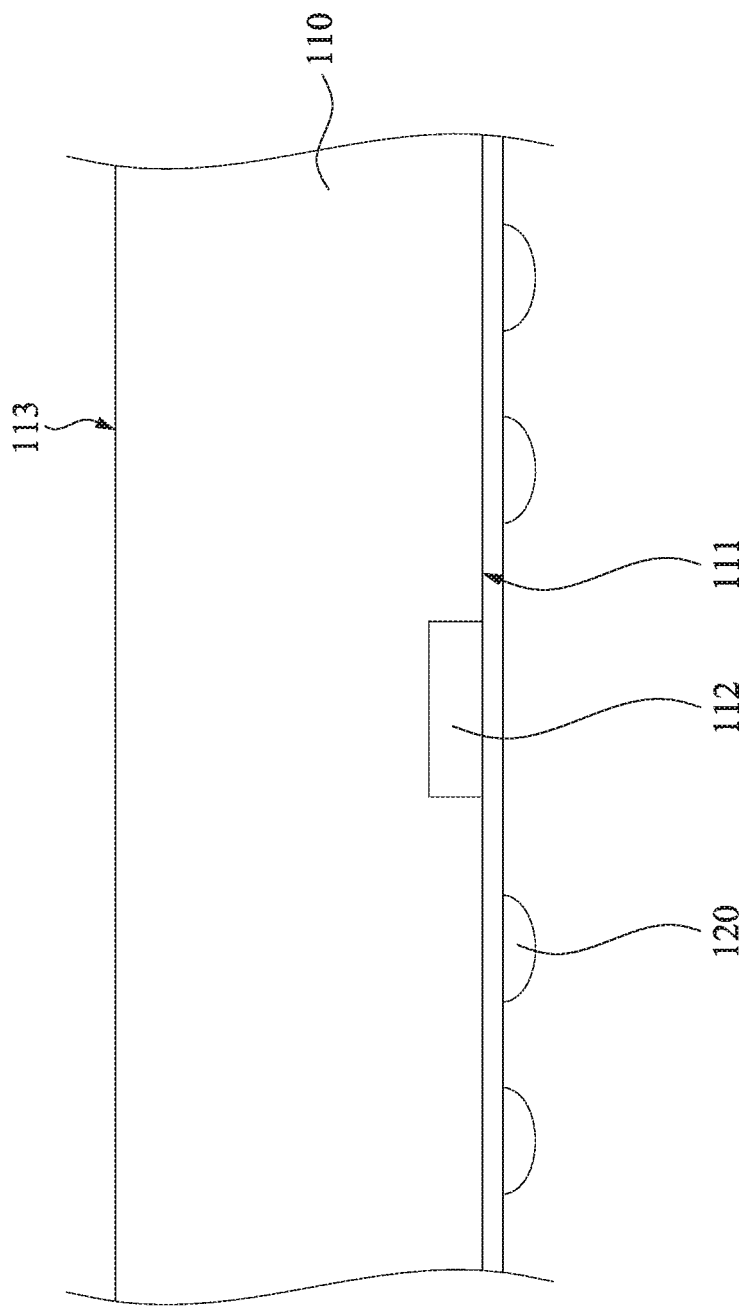
FIG. 3 to FIG. 6 are cross-sectional views at various stages of a manufacturing method of the chip package of FIG. 2.

FIG. 3 to FIG. 6 is cross-sectional views at various stages of a manufacturing method of the chip package 100 of FIG. 2. As shown in FIG. 3, a wafer 110 is provided, in which the first surface 111 of the wafer 110 has the photodiode 112, and the conductive structure 120 is formed on the first surface 111 of the wafer 110. In the present disclosure, the wafer 110 is a semiconductor structure of the chip 110 before dicing in FIG. 2. The wafer 110 in FIG. 3 has not been polished and has greater thickness, and the second surface 113 has not been etched and is flat.

Figure 4:
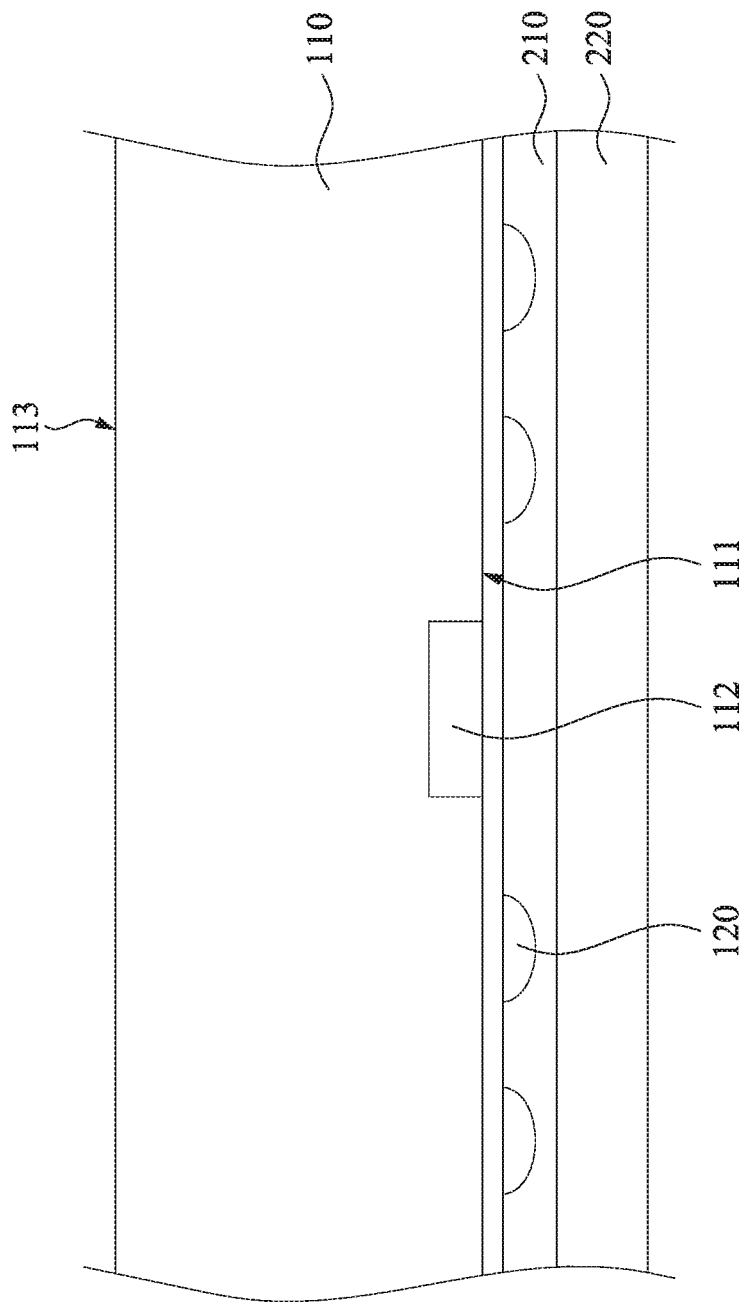
Figure 5:
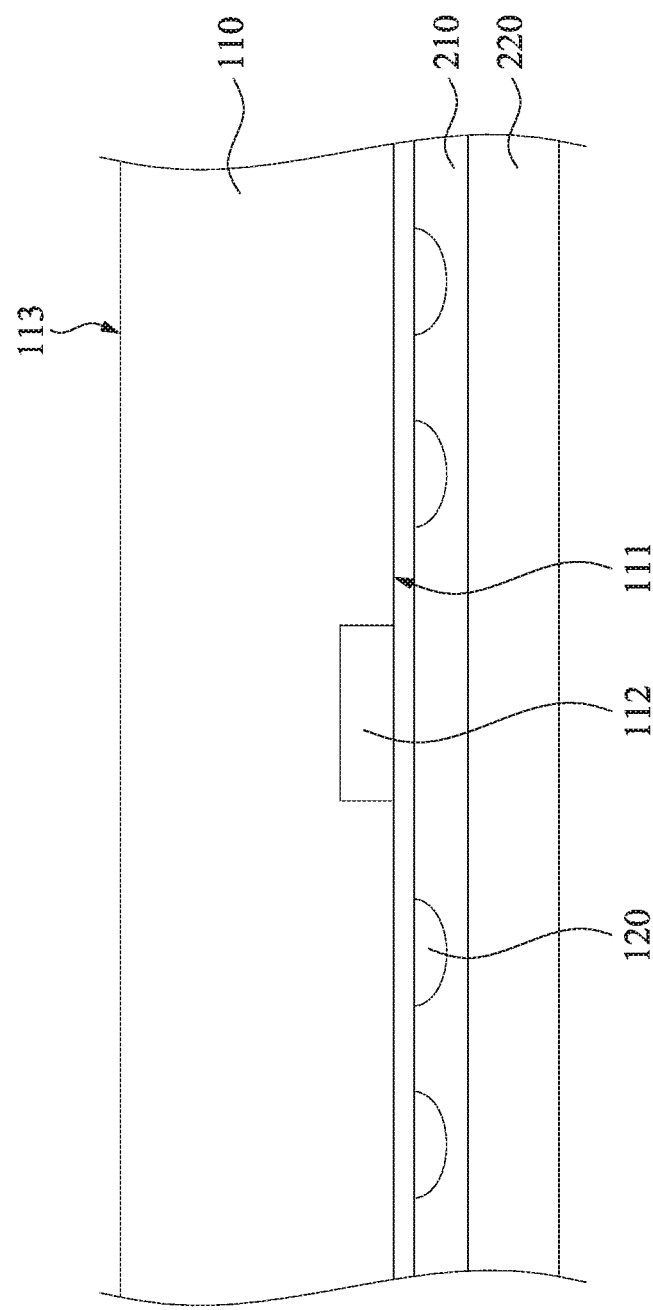

Then, as shown in FIG. 4, bond the carrier 220 on the first surface 111 of the wafer 110 using a temporary adhesive layer 210. The carrier 220 may provide sufficient supporting strength for subsequent manufacturing processes to avoid the wafer 110 to crack. As shown in FIG. 5, after bonding the carrier 220 with the wafer 110, the second surface 113 of the wafer 110 may be polished to make the wafer 110 thinner.

Figure 6:
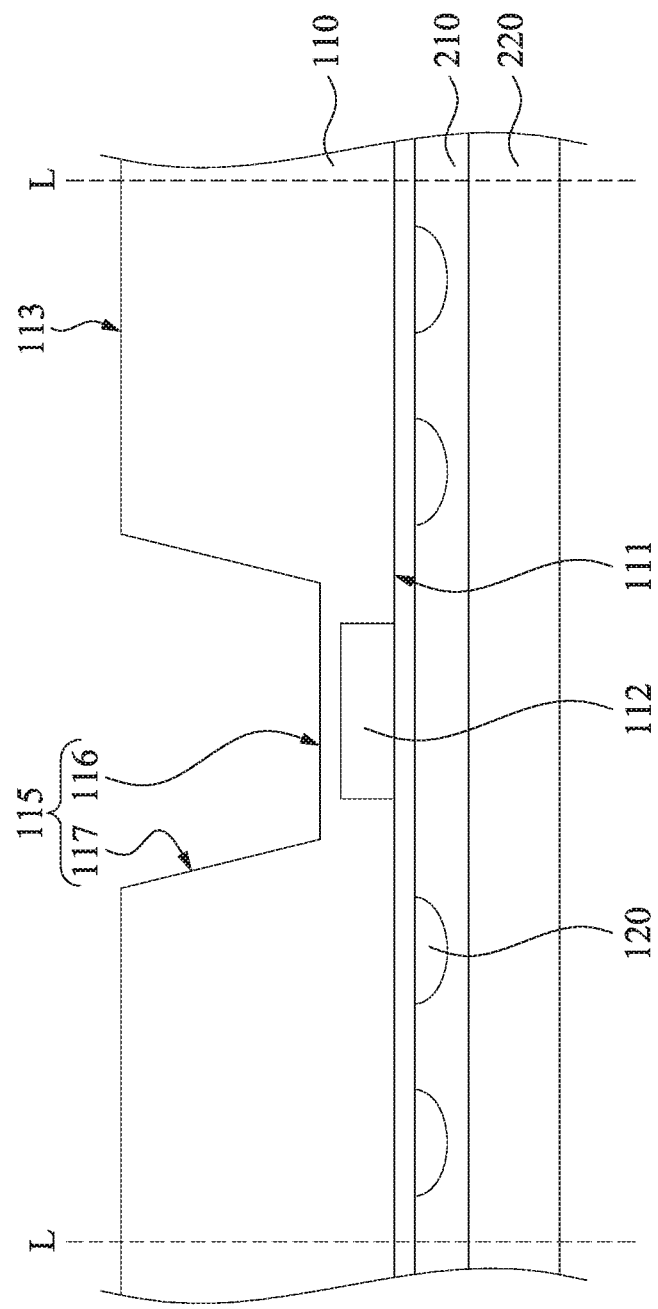

After polishing the second surface 113 of the wafer 110, as shown in FIG. 6, the second surface 113 of the wafer 110 may be etched such that the second surface 113 of the wafer 110 has the trench 115 aligned to the photodiode 112. Before etching the second surface 113 of the wafer 110, there may include lithography technologies such as exposure, development, and etc. After the trench 115 of the wafer 110 is formed, the temporary adhesive layer 210 and the carrier 220 may be removed. For instance, heat, light beam or chemical solution may be applied on the temporary adhesive layer 210, to eliminate the adhesion of the temporary adhesive layer 210, but the present invention is not limited in this regard. Then, the wafer 110 may be diced along the line L, and the chip package 100 of FIG. 2 is therefore obtained.

Other types of chip package are described in the following.

Figure 7:
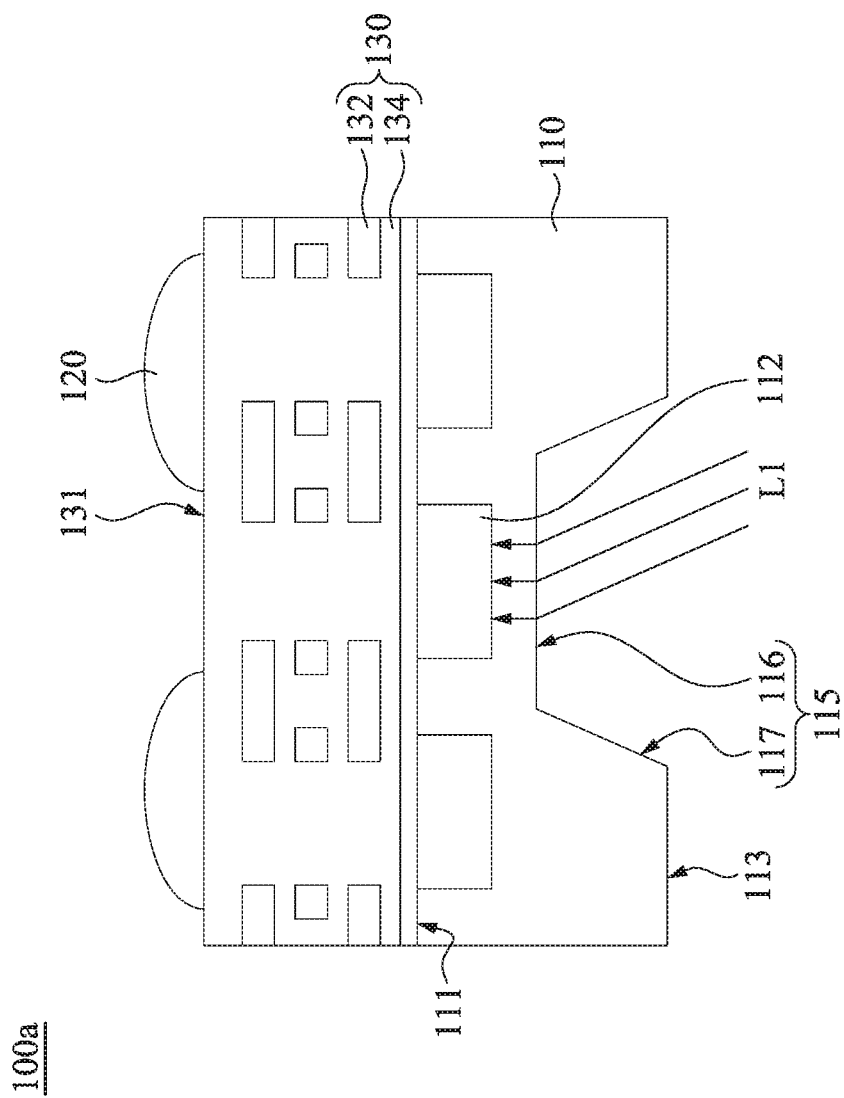
FIG. 7 is a cross-sectional view of a chip package according to one embodiment of the present invention.

FIG. 7 is a cross-sectional view of a chip package 100a according to one embodiment of the present invention. The chip package 100a includes the chip 110 and the conductive structure 120. The difference between the embodiment of FIG. 2 and the embodiment of FIG. 7 is that the chip package 100a further includes a stacked structure 130. The stacked structure 130 is located between the first surface 111 of the chip 110 and the conductive structure 120. The stacked structure 130 has a metal wire layer 132 and a dielectric layer 134 that covers the metal wire layer 132. The present invention is not limited by a quantity of the metal wire layer 132 and a quantity of the dielectric layer 134. Furthermore, in this embodiment, the chip 110a has the quantity of the photodiode 112 greater than the quantity of the trench 115, such as having three photodiode 112 and one trench 115. The photodiode 112 may receive a light L1 entering through the trench 115 below it.

Figure 8:
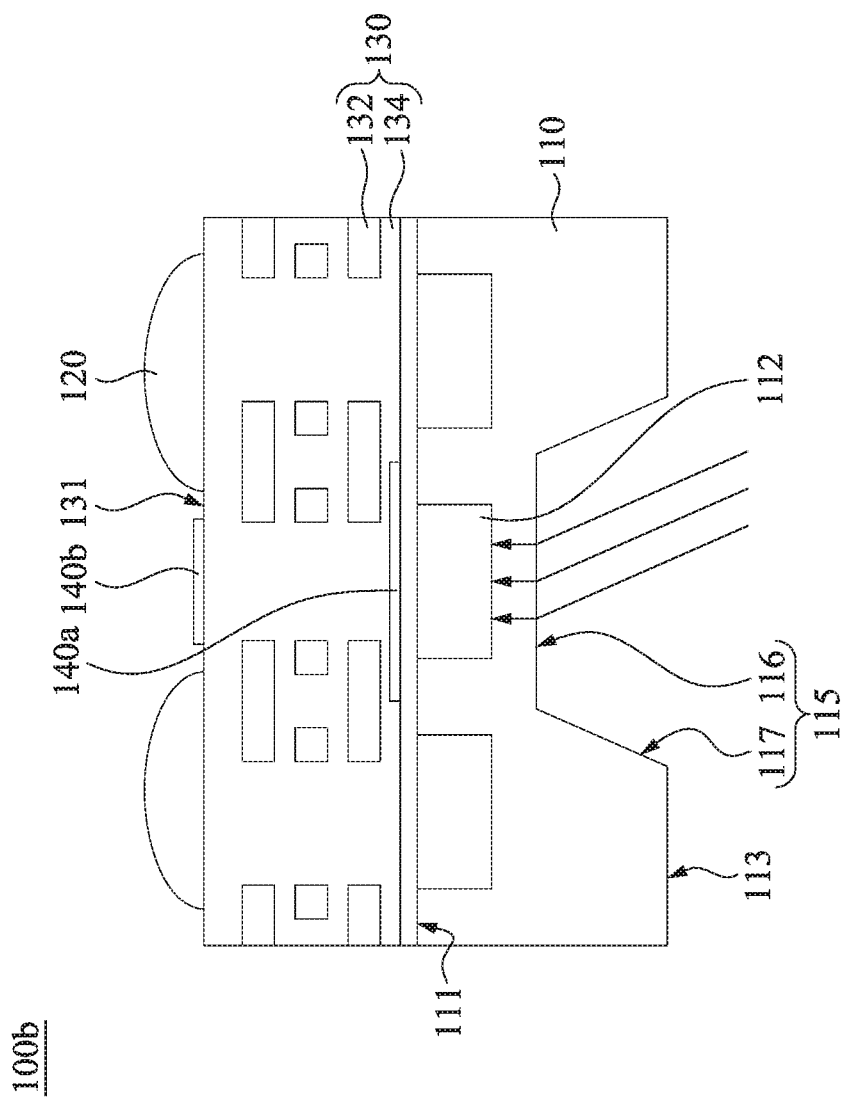
FIG. 8 is a cross-sectional view of a chip package according to one embodiment of the present invention.

FIG. 8 is a cross-sectional view of a chip package 100b according to one embodiment of the present invention. The chip package 100b includes the chip 110 and the conductive structure 120. The difference between the embodiment of FIG. 7 and the embodiment of FIG. 8 is that the chip package 100b further includes a light-shielding layer 140a and a light-shielding layer 140b. The light-shielding layer 140a is located between the stacked structure 130 and the photodiode 112, and overlaps the photodiode 112. The stacked structure 130 has a surface 131 opposite to the chip 110. The light-shielding layer 140b and the conductive structure 120 are on the surface 131 of the stacked structure 130, and the light-shielding layer 140b overlaps the photodiode 112. That is to say, the light-shielding layer 140a, the light-shielding layer 140b, and the photodiode 112 overlap, avoiding light to enter the chip package 100b by the surface 131 of the stacked structure 130, to be sensed by photodiode 112, and to cause noise.

Figure 9:
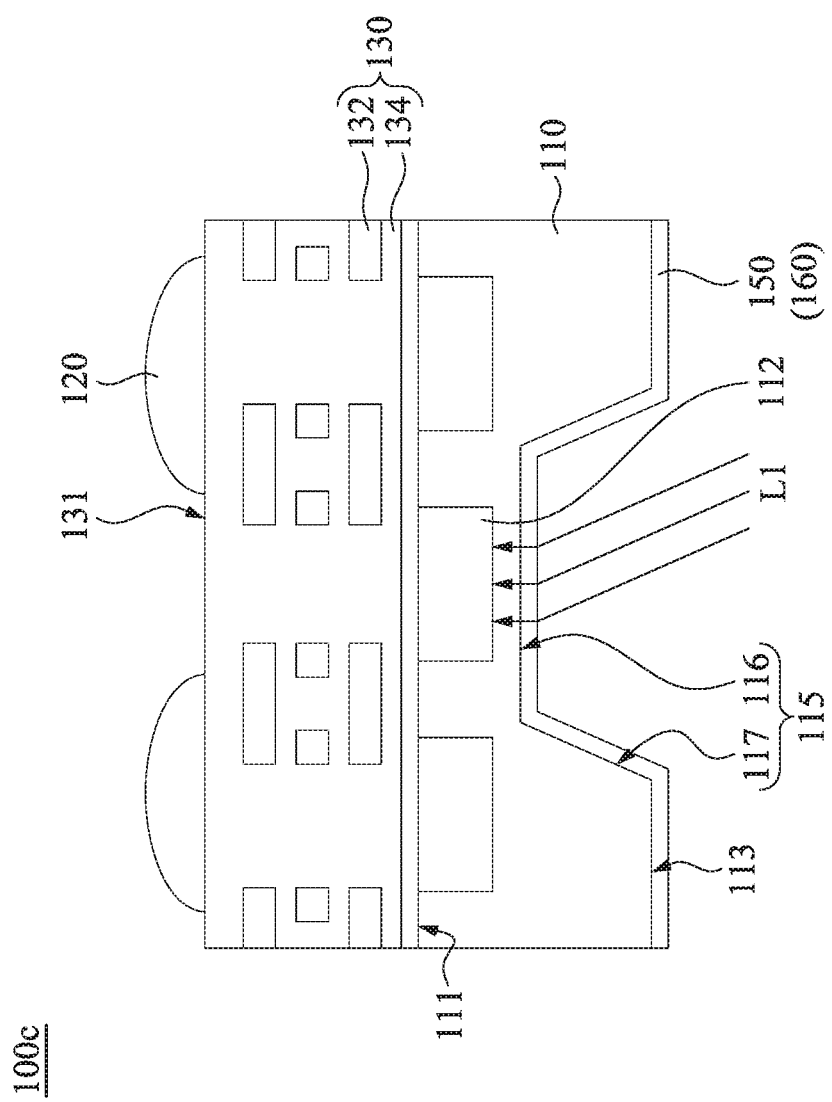
FIG. 9 is a cross-sectional view of a chip package according to one embodiment of the present invention.

FIG. 9 is a cross-sectional view of a chip package 100c according to one embodiment of the present invention. The chip package 100c includes the chip 110 and the conductive structure 120. The difference between the embodiment of FIG. 7 and the embodiment of FIG. 9 is that the chip package 100c further includes a protective layer 150. The protective layer 150 covers the trench 115 and the second surface 113 of the chip 110. Specifically, the protective layer 150 covers the bottom surface 116 and the sidewall 117 of the trench 115, and extends to the second surface 113. The protective layer 150 has an isolation effect, and may avoid moisture and dust entering the chip package 100c, extending the life time of the chip package 100c.

In another embodiment, the chip package 100c further includes an anti-reflection layer 160 but does not have the protective layer 150. The anti-reflection layer 160 covers the trench 115 and the second surface 113 of the chip 110. Specifically, the anti-reflection layer 160 covers the bottom surface 116 and the sidewall 117 of the trench 115, and extends on the second surface 113. The anti-reflection layer 160 has an anti-reflection effect. It enhances light L1 to enter the chip 110 and improves the accuracy of detection.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A chip package, comprising:
a chip, wherein a first surface of the chip has a photodiode, and a second surface of the chip opposite to the first surface has a trench, and the trench is aligned to the photodiode, the trench has a bottom surface and a sidewall surrounding the bottom surface and an obtuse angle is between the sidewall and the bottom surface;
a conductive structure above the first surface of the chip;
a stacked structure located between the first surface of the chip and the conductive structure, wherein the stacked structure has a surface facing away from the chip; and
a first light-shielding layer, wherein the first light-shielding layer and the conductive structure are both located on the surface of the stacked structure, and the first light-shielding layer overlaps the photodiode.

2. The chip package of claim 1, wherein a normal projection of the conductive structure on the first surface is spaced apart from the photodiode.

3. The chip package of claim 1, wherein a part of the chip is located between the photodiode and the bottom surface of the trench.

4. The chip package of claim 1, wherein a width of the trench is gradually decreased from the second surface to the bottom surface of the trench.

5. The chip package of claim 1, wherein a width of the bottom surface of the trench is greater than or equal to a width of the photodiode.

6. The chip package of claim 1, wherein a distance between the bottom surface of the trench and the first surface of the chip is greater than a thickness of the photodiode.

7. The chip package of claim 6, wherein the distance between the bottom surface of the trench and the first surface of the chip is in a range from 10 μm to 100 μm.

8. The chip package of claim 1, wherein the stacked structure has a metal wire layer and a dielectric layer that covers the metal wire layer.

9. The chip package of claim 8, further comprising:
a second light-shielding layer located between the stacked structure and the photodiode.

10. The chip package of claim 1, further comprising:
a protective layer covering the trench and the second surface of the chip.

11. The chip package of claim 1, further comprising:
an anti-reflection layer covering the trench and the second surface of the chip.

12. A manufacturing method of a chip package, comprising:
forming a conductive structure on a first surface of a wafer, wherein the first surface of the wafer has a photodiode, and a vertical projection of the conductive structure on the first surface of the wafer is spaced apart from a vertical projection of the photodiode on the first surface of the wafer;
bonding a carrier to the first surface of the wafer using a temporary adhesive layer;
etching a second surface of the wafer opposite to the first surface such that the second surface of the wafer has a trench aligned to the photodiode, wherein the trench has a bottom surface and a sidewall surrounding the bottom surface, and an obtuse angle is between the sidewall and the bottom surface; and
removing the carrier.

13. The manufacturing method of the chip package of claim 12, further comprising:
polishing the second surface of the wafer before etching the second surface of the wafer.

14. The manufacturing method of the chip package of claim 12, further comprising:
dicing the wafer after removing the carrier.

15. A chip package, comprising:
a chip, wherein a first surface of the chip has a photodiode, and a second surface of the chip opposite to the first surface has a trench, and the trench is aligned to the photodiode, a width of the bottom surface of the trench is greater than or equal to a width of the photodiode;
a conductive structure above the first surface of the chip;
a stacked structure located between the first surface of the chip and the conductive structure, wherein the stacked structure has a surface facing away from the chip; and
a first light-shielding layer, wherein the first light-shielding layer and the conductive structure are both located on the surface of the stacked structure, and the first light-shielding layer overlaps the photodiode.

* * * * *